(12) United States Patent
Royle et al.

(10) Patent No.: US 7,994,770 B2
(45) Date of Patent: Aug. 9, 2011

(54) TRANSMITTER OF A SYSTEM FOR DETECTING A BURIED CONDUCTOR

(75) Inventors: John Mark Royle, Exeter (GB); Richard David Pearson, Bristol (GB)

(73) Assignee: Radiodetection Limited, Bristol (GB)

( * ) Notice: Subject to any disclaimer, the term of this patent is extended or adjusted under 35 U.S.C. 154(b) by 319 days.

(21) Appl. No.: 12/395,837

(22) Filed: Mar. 2, 2009

(65) Prior Publication Data

US 2010/0001731 A1   Jan. 7, 2010

(30) Foreign Application Priority Data

Feb. 29, 2008   (GB) .................................. 0803871.3

(51) Int. Cl.
*G01R 19/00* (2006.01)
*G01V 3/08* (2006.01)

(52) U.S. Cl. .......................................... 324/67; 324/329

(58) Field of Classification Search ........................ None
See application file for complete search history.

(56) References Cited

U.S. PATENT DOCUMENTS

| | | | |
|---|---|---|---|
| 6,356,082 B1 * | 3/2002 | Alkire et al. ................. | 324/326 |
| 6,617,856 B1 * | 9/2003 | Royle et al. ................. | 324/329 |
| 7,091,872 B1 | 8/2006 | Bigelow et al. | |
| 7,358,738 B2 * | 4/2008 | Overby et al. ................ | 324/326 |
| 2004/0137856 A1 | 7/2004 | Kanazawa et al. | |
| 2005/0096879 A1 * | 5/2005 | Waite et al. ................. | 702/189 |
| 2005/0156600 A1 | 7/2005 | Olsson et al. | |
| 2006/0036376 A1 | 2/2006 | Gudmundsson et al. | |

FOREIGN PATENT DOCUMENTS

| | | |
|---|---|---|
| GB | 2363010 A | 12/2001 |
| WO | 03069769 A2 | 8/2003 |
| WO | 2005111662 A1 | 11/2005 |

\* cited by examiner

*Primary Examiner* — Minh N Tang
(74) *Attorney, Agent, or Firm* — Baker & Hostetler LLP

(57) ABSTRACT

A system for detecting a buried conductor comprises a transmitter for generating a test signal in the buried conductor and a detector for detecting an electromagnetic signal resulting from the test signal flowing in the buried conductor. The transmitter comprises a waveform generator for generating a drive waveform signal, a power supply, an amplifier, connected to the power supply and the waveform generator for producing an output drive signal based on the drive waveform signal and an output circuit for acting on the output drive signal to generate an output signal having a current and a voltage. In-phase and quadrature components of the current and voltage of the output signal are fed back for controlling the amplifier.

24 Claims, 3 Drawing Sheets

TRANSMITTER OF A SYSTEM FOR DETECTING A BURIED CONDUCTOR

CROSS REFERENCE TO RELATED APPLICATIONS

This application claims priority to United Kingdom Patent Application GB 0803871.3, filed on Feb. 29, 2008, and entitled "Transmitter of a System for Detecting a Buried Conductor," the disclosure of which is incorporated herein by reference in its entirety.

FIELD OF THE INVENTION

The present invention relates to a transmitter of a system and method for detecting a buried conductor.

BACKGROUND OF THE INVENTION

Before commencing excavation or other work where electrical cables, fibre optic cables or other utilities ducts or pipes are buried, it is important to determine the location of such buried cables or pipes to ensure that they are not damaged during the work. Once a buried utility is located the depth of the utility can be calculated to determine a safe excavation depth.

Current carrying conductors emit electromagnetic radiation which can be detected by an electrical antenna. If fibre optic cables or non-metallic utilities ducts or pipes are fitted with a small electrical tracer line, an alternating electrical current can be induced in the tracer line which in turn radiates electromagnetic radiation. It is known to use detectors to detect the electromagnetic field emitted by conductors carrying alternating current.

One type of such detector works in one of two modes, namely 'active' or 'passive' modes. Each mode has its own frequency band or bands of detection.

In passive mode, the detector detects ambient magnetic fields, for example those produced by a conductor carrying an AC mains power supply at $^{50}/_{60}$ Hz and very low frequency (VLF) signals originating from VLF long wave transmitters.

In active mode a signal generator/transmitter is used to produce an alternating test signal in the conductor in accordance with one of three mechanisms. If the transmitter can be directly connected to the conductor then an alternating test signal of known frequency waveform and modulation is applied directly to the conductor.

If the conductor is accessible but direct connection is not feasible, for example where the conductor is carrying live mains power, a clamp can be used to apply the transmitter test signal to the conductor. The clamp is typically comprised of a split toroidal magnetic core which carries a primary winding magnetising the core with the alternating transmitter signal. An alternating signal flowing in the winding produces an electromagnetic signal in the conductor similar in operation to a transformer.

Where access to the conductor is not possible, the signal transmitter produces an alternating electromagnetic field by use of a strong induction loop. If the transmitter is placed near to the buried conductor then the electromagnetic field induces a current in a nearby buried conductor.

In all three mechanisms of stimulating a test signal in the buried conductor in the active mode, the buried conductor radiates the signal produced by the signal transmitter and the radiated signal can be detected by a detector.

A number of factors must be considered when using the active mode. As the transmitter is conventionally powered by on-board batteries it is important to efficiently generate the test signal whilst conserving the power expended by the transmitter as much as possible so as to prolong the battery life of the transmitter. Therefore the power of a signal output from the transmitter should be minimised to reduce battery consumption. In addition, a high power signal can couple to unwanted lines and spread over the lines, making it difficult to detect the target buried conductor.

The transmitter can be configured to transmit an alternating test signal at a number of frequencies and waveform types. The choice of frequency depends on a number of factors, for example the ease of inducing the test signal into the buried conductor and interference from ambient signals.

Regarding the choice of frequency of the alternating test signal, a high frequency signal is typically used for a high resistance line or a small insulated telecoms line, although that signal decreases more rapidly with distance along the conductor than for a lower frequency. A medium frequency signal is typically used for mains power supply cables and continuous metal pipes and a low frequency signal is used for long distance tracing where a defined termination is used (earth).

A problem with conventional signal transmitters is that the transmitter performs poorly in response to a change in the load, which can lead to damage to the transmitter. Although conventional signal transmitters comprise a basic feedback loop to stabilise the signal output from the transmitter, the control law used does not allow the transmitter to react quickly to changes in the load. For example, sudden disconnection of the load may not be expediently detected by the transmitter, resulting in driving the amplifiers too hard and potentially damaging the transmitter. In addition, the feedback loop can detect and process ambient signals and inefficiently drive amplifiers in the transmitter based on the ambient signals.

SUMMARY OF THE INVENTION

Embodiments of the present invention advantageously provide a transmitter of a system for detecting a buried conductor, and an associated method.

According to a first aspect of the invention there is provided a transmitter comprising: means for generating a drive waveform signal; power supply means; amplifier means connected to the power supply and the waveform generator for producing an output drive signal based on the drive waveform signal; output means for acting on the output drive signal to generate an output signal having a current and a voltage; and feedback means for controlling the amplifier means on the basis of the output signal wherein the feedback means provides in-phase and quadrature components of the current and voltage of the output signal.

The feedback voltage and current of the output signal may be filtered through a narrow band filter. The narrowband filter may have a bandwidth of less than 100 Hz, preferably less than 75 Hz or preferably less than 40 Hz.

The narrowband filter may be a sinc filter. The sinc filter may be implemented with a finite impulse response filter.

The feedback voltage and current may be sampled above the Nyquist frequency with respect to the transmitter output signal.

The amplifier means may comprise an H-bridge D-class amplifier and a bridge tied linear amplifier. The H-bridge D-class amplifier may operate in a range of the output signal of DC to a predetermined frequency, such as, e.g., 40 KHz.

The H-bridge D-class amplifier may be modulated using a delta-sigma modulation scheme in the range of the output signal of DC to 8 KHz and the H-bridge D-class amplifier may be modulated using a pulse width modulation scheme in the range of the output signal of 8 KHz to 40 KHz.

The bridge tied linear amplifier may be driven by the drive waveform signal in a range of the output signal above a predetermined frequency, such as, e.g., 40 KHz.

The bridge tied linear amplifier may be driven by a variable power supply.

The drive waveform signal may be generated by a proportional-integral-derivative controller.

According to a second aspect of the invention there is provided a system for detecting a buried conductor comprising: a transmitter as described above and a receiver for detecting a signal induced in said buried conductor by the output signal of the transmitter.

According to a third aspect of the invention there is provided a method of generating a transmitter output signal comprising: generating a drive waveform signal; amplifying the drive waveform signal to produce an output drive signal; generating an output signal based on the output drive signal, the output signal having a current and a voltage; and feeding back in-phase and quadrature components of the current and voltage of the output signal for controlling the amplification.

The feedback voltage and current of the output signal may be filtered through a narrow band filter. The narrowband filter may have a bandwidth of less than 100 Hz, preferably less than 75 Hz and preferably less than 40 Hz.

The narrowband filter may be a sinc filter. The sinc filter may be implemented with a finite impulse response filter.

The feedback voltage and current may be sampled above the Nyquist frequency with respect to the transmitter output signal.

The amplification may be performed by an H-bridge D-class amplifier and a bridge tied linear amplifier. The H-bridge D-class amplifier may operate in a range of the output signal of DC to a predetermined frequency, such as, e.g., 40 KHz.

The H-bridge D-class amplifier may be modulated using a delta-sigma modulation scheme in the range of the output signal of DC to 8 KHz and the H-bridge D-class amplifier may be modulated using a pulse width modulation scheme in the range of the output signal of 8 KHz to 40 KHz.

The bridge tied linear amplifier may be driven by the drive waveform signal in a range of the output signal above a predetermined frequency, such as, e.g., 40 KHz.

The bridge tied linear amplifier may be driven by a variable power supply.

The drive waveform signal may be generated by a proportional-integral-derivative controller.

According to a fourth aspect of the invention there is provided a carrier medium carrying computer readable code for controlling a microprocessor to carry out the method described above.

According to a fifth aspect of the invention there is provided a method of detecting a buried conductor comprising: generating a transmitter output signal as described above to induce a test signal in said buried conductor, the test signal generating an electromagnetic field; and detecting the generated electromagnetic field.

According to a further aspect of the invention there is provided a transmitter comprising: a waveform generator for generating a drive waveform signal; a power supply; an amplifier stage connected to the power supply and the waveform generator for producing an output drive signal based on the drive waveform signal; an output circuit for acting on the output drive signal to generate an output signal having a current and a voltage; and a feedback connection for controlling the amplifier stage on the basis of the output signal wherein the feedback connection provides in-phase and quadrature components of the current and voltage of the output signal.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
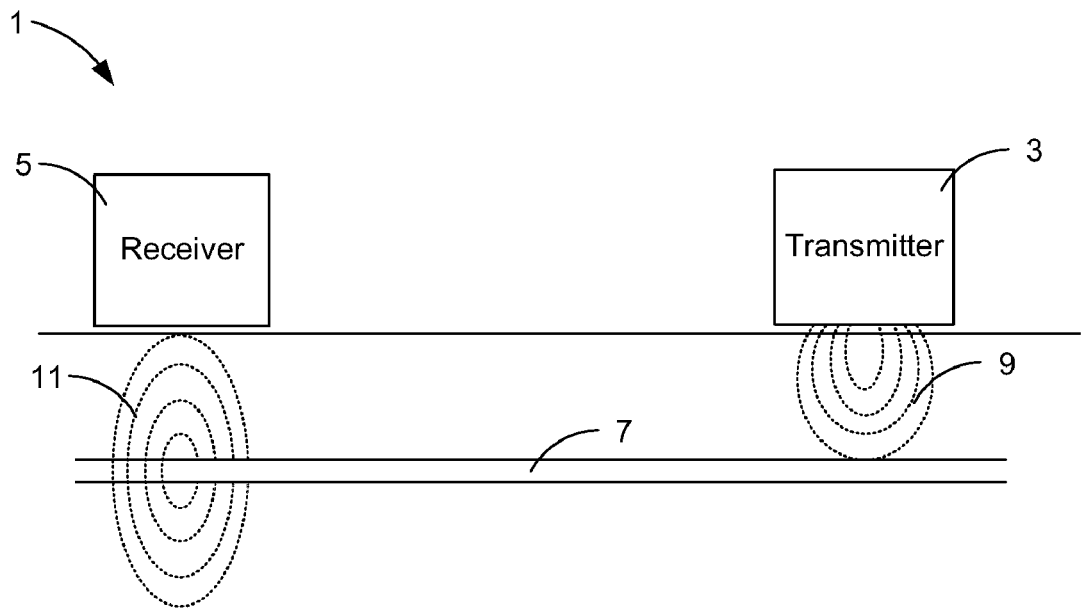
FIG. 1 is a schematic representation of a system for detecting a buried conductor according to an embodiment of the invention.

The invention will now be described with reference to the drawing figures, in which like reference numerals refer to like parts throughout.

FIG. 1 is a schematic representation of a system 1 for detecting a buried conductor according to an embodiment of the invention, comprising a portable transmitter 3 and a portable receiver 5. The transmitter 3 is placed in proximity to a buried conductor 7 to produce an alternating current test signal in the buried conductor 7.

An aerial in the transmitter 3 is fed with an AC voltage to produce an electromagnetic field 9 which links around the buried conductor 7, thereby inducing the alternating current test signal in the buried conductor 7. The alternating current test signal is radiated as an electromagnetic field 11 by the buried conductor 7 and this electromagnetic field can be detected by the receiver 5. In other embodiments the transmitter may provide a test signal in the conductor by direct connection to the conductor or by clamping around the conductor, as described above.

Figure 2:
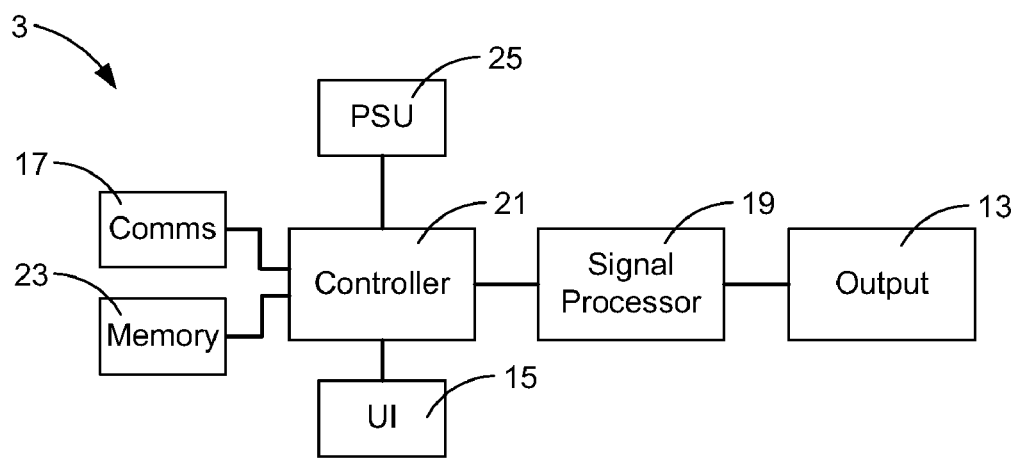
FIG. 2 is a block diagram of the transmitter of the system of FIG. 1.

FIG. 2 is a block diagram of the transmitter 3 of the system 1 of FIG. 1. The output signal of the transmitter 3 is radiated by an output module 13 and coupled into the buried conductor 7 to produce the alternating test signal in the buried conductor 7. The output module 13 may also flood an area with an output signal which energises all conductor lines in the area.

The operation of the transmitter 3 is determined by an operator either via a user interface module 15 or by the commands received at a communications module 17 of the transmitter 3. The predetermined characteristics of the output signal of the transmitter 3 comprise the signal's power, frequency and modulation scheme. The power of the signal output from the transmitter 3 is primarily controlled by varying the signal's current. Once the desired characteristics of the output signal are determined, a signal processor module 19 drives the output module 13 and monitors the signal output from the output module 13 to ensure that the signal output from the output module 13 conforms to the predetermined characteristics.

The user interface module 15 conveys information to the operator of the transmitter 3 and may comprise one or more of a display for displaying information to the operator of the device, input devices such as a keypad or a touch sensitive screen and an audible output device such as a speaker or beeper. The communications module 17 may send and receive commands to/from a communications module of the receiver 5 and/or enable the transmitter 3 to be connected to a personal computer (PC) or a personal digital assistant (PDA) (not shown). The transmitter 3 further comprises a memory module 23 and a power supply unit (PSU) 25, acting as a power supply means, comprising power management circuitry and a power source such as batteries. The overall control of the various components of the transmitter 3 is managed by a controller 21. The components of the portable detector 3 are housed in a housing (not shown).

Figure 3:
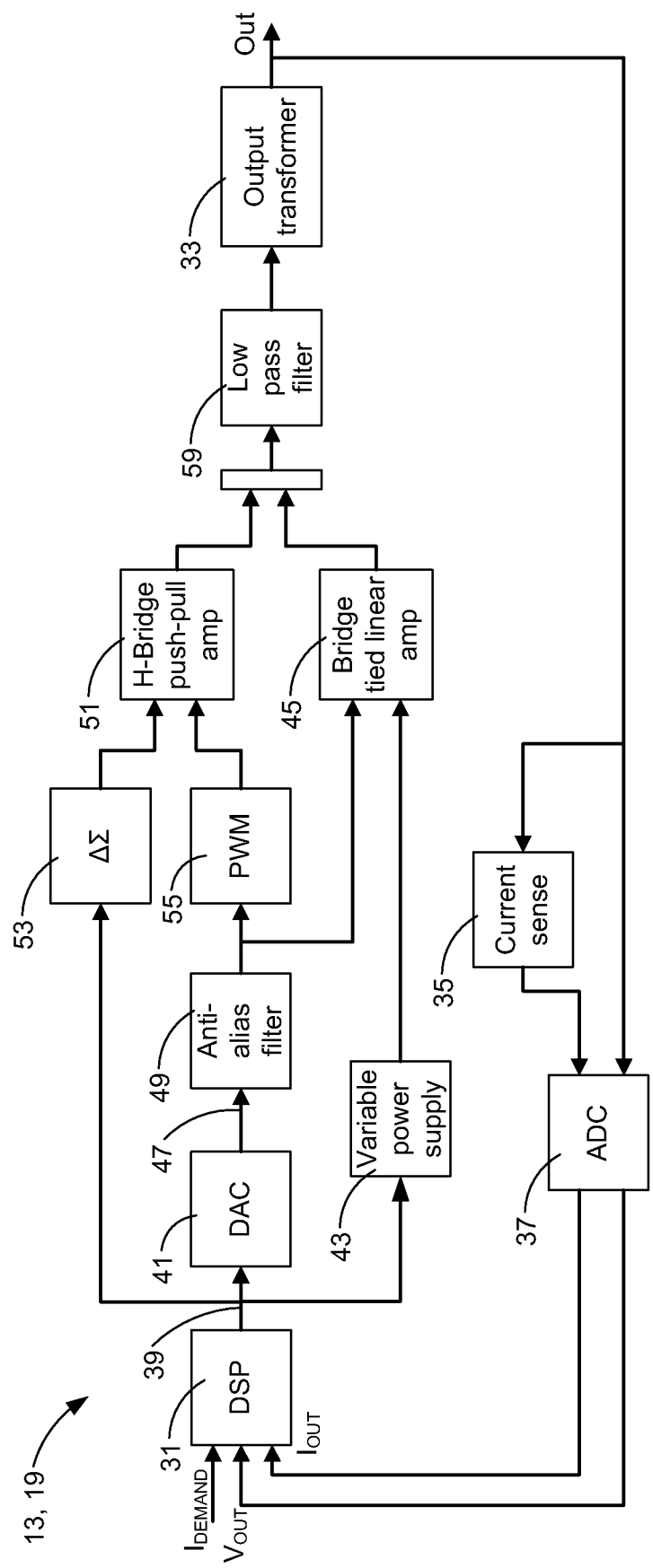
FIG. 3 is a block diagram of signal processor and output modules of the transmitter of FIG. 2.

FIG. 3 is a block diagram of the output module 13 and the signal processor module 19 of the transmitter 3 of FIG. 2. The predetermined characteristics of the signal to be output from the transmitter 3, which are input by an operator of the transmitter 3, are passed to a digital signal processor (DSP) 31 of the signal processor module 19 as a current demand signal, $I_{demand}$. The digital signal processor 31 also receives signals representing the output current $I_{out}$ and output voltage $V_{out}$ of the transmitter 3. These representative signals are generated by monitoring the signal output from an output transformer 33 of the transmitter 3 to give an analogue output voltage signal; additionally converting the output voltage using a current sense stage 35 to give an analogue output current signal; and digitizing the analogue output voltage signal and the analogue output current signal to give digitized versions of these signals which are passed to the DSP 31.

The analogue output voltage signal and analogue output current signal are digitized in an analogue-to-digital converter (ADC) 37 at a sampling rate of 500 KHz, this being above the Nyquist sampling frequency with respect to the transmitter output signal, the transmitter 3 operating, in general, at a maximum signal frequency of 200 KHz.

The DSP 31 processes the current demand and digitized output signals and, acting as a means for generating a drive waveform signal, generates a drive waveform signal 39 which is passed to a digital-to-analogue converter (DAC) 41. The drive waveform may be a sine wave, a current direction waveform comprising two signal components of different frequency for detecting coupling of the test signal onto a nearby conductor as described in U.S. Pat. No. 5,260,659, assigned to Radiodetection Limited on its face, the contents of which are incorporated herein by reference, a fault finding waveform such as the waveform described in U.S. Pat. No. 4,896,117, assigned to Radiodetection Limited on its face, the contents of which are incorporated herein by reference, as well as U.S. Pat. No. 5,260,659, assigned to Radiodetection Limited on its face, the contents of which are incorporated herein by reference, or other waveform to be detected by the receiver 5. The drive waveform signal 39 is also passed to a variable power supply module 43 which controls the power supply to a bridge tied linear amplifier 45, as explained below.

The analogue drive waveform signal 47 output from the DAC 41 is filtered with an anti-alias filter 49, in this case a $5^{th}$ order Chebychev filter, to remove high frequency artefacts resulting from the digital to analogue conversion. This cleaning up of the output waveform ensures that energy is not wasted in the power amplifiers.

The output module 13 of the transmitter 3 comprises amplifier means and operates in one of three output schemes, depending on the frequency of the output signal.

Below around 40 KHz a D-class amplifier is used. The D-class amplifier is comprised of an H-bridge of MOSFETs 51 modulated as push-pull switches. In the sub-range of DC to around 8 KHz the signal input to the H-bridge amplifier 51 is modulated using a Delta-Sigma ($\Delta$-$\Sigma$) modulation scheme 53 which is particularly efficient for generating low frequencies into low impedance loads. Delta-Sigma modulation is performed by the DSP 31, the output of which drives the H-bridge directly. Further details of the Delta-Sigma modulation scheme are provided in GB 2363010 in the name of Radiodetection Limited, the contents of which are incorporated herein by reference.

Above 8 KHz the switching losses in the MOSFETs become dominant so in the sub-range of 8 KHz to 40 KHz the H-bridge amplifier is modulated using a pulse width modulation (PWM) scheme 55. The drive waveform signal output from the anti-alias filter 49 is converted to a sequence of pulses whose average value is directly proportional to the amplitude of the signal at that time. The PWM frequency in this case is chosen as 262 KHz and is phase locked to the DSP sampling which is a key parameter in overcoming unwanted frequency artefacts in the output.

Above 40 KHz the H-Bridge MOSFETs 51 suffer increasingly dominant switching losses due to the gate capacitance. Therefore in the frequency range 40 KHz to 200 KHz and above a bridge tied linear amplifier 45 is used so that a full rail-to-rail voltage swing is available. The linear amplifier is fed with the signal directly output from the anti-alias filter 49. In addition, the bridge tied linear amplifier 57 is subject to a variable power rail by means of the variable power supply module 43 so that intrinsic losses of voltage regulation can be minimised for loads and demand where voltage swing across the fully available rail-to-rail voltage is not required.

The outputs of the H-bridge push-pull amplifier 51 and the bridge tied linear amplifier 45 are fed into a low pass filter 59 to remove unwanted switching artefacts and the filtered signal is fed into an output transformer 33. The output transformer 33 is used to generate an alternating current test signal in the buried conductor 7 by direct connection, toroidal clamping or induction using standard apparatus and techniques as is well known in the art.

The transmitter provides a maximum load line power of 10 W for output signals up to 40 KHz and a maximum load line power of 1 W for output signals above 40 KHz (for compliance with Electromagnetic Compatibility (EMC) regulations). The 10 W load line is designed around the standard assumption of a 300Ω load which is a typical impedance for wet clay conditions. In addition a power efficient amplifier gives the battery powered transmitter a good operating life.

The transmitter 3 acts as a programmable current source in a frequency range from DC to 200 KHz. The transmitter 3 is capable of providing a very stable output, with no modulation artefacts visible above −80 dB. In addition the transmitter 5 is capable of driving loads of all conceivable impedance. In particular the transmitter is capable of driving loads with a low impedance of only a few ohms, i.e., almost a dead-short, such as an earthed gas pipe; very high impedance loads such as insulated cables and dry-soil having an impedance of 1 M ohm and a 100 nf capacitance; and inductive loads through a clamp.

Figure 4:
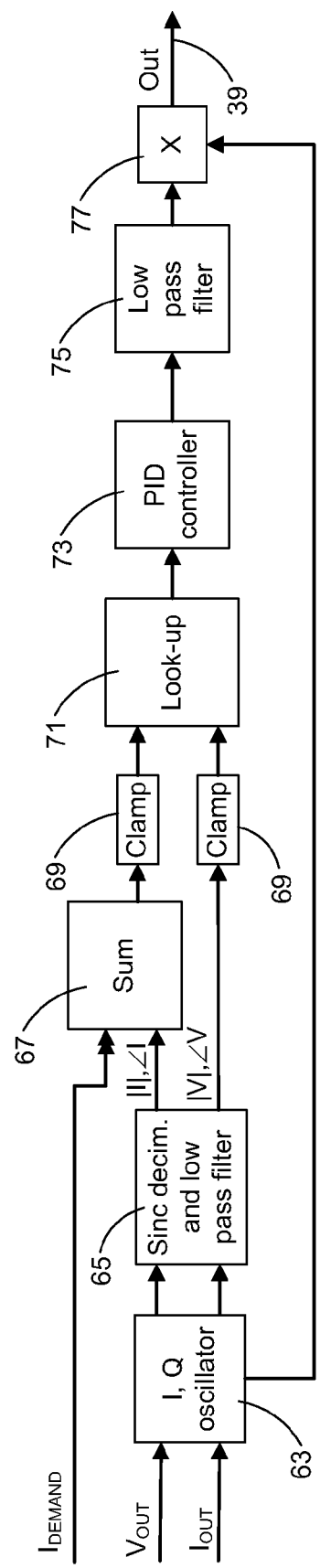
FIG. 4 is a block diagram of the control law controlling the transmitter of FIG. 2.

FIG. 4 shows a block diagram of the control law used for controlling the transmitter 3 which is implemented in the DSP 31 of FIG. 3. The DSP 31 receives digitized inputs $I_{out}$ and $V_{out}$ from the ADC 37 at a rate of 500 KHz and the $I_{demand}$ signal.

The first stage of the control law is an in-phase and quadrature (IQ) oscillator 63. The IQ oscillator 63 derives sine and cosine waveforms from the $I_{out}$ and $V_{out}$ signals that are phase locked in a quadrature relationship to one another, i.e., that are 90° out of phase, and that have stabilised amplitudes. The sine and cosine waveforms are used in the oscillator 63 to establish both in-phase and quadrature components of the $I_{out}$ and $V_{out}$ signals which are passed to a sinc decimator and low pass filter stage 65. Further details of the IQ oscillator 63 are provided in U.S. Pat. No. 6,642,796, assigned to Radiodetection Limited on its face, the contents of which are incorporated herein by reference.

The sinc decimator and low pass filter stage 65 receives the I and Q components of the $I_{out}$ and $V_{out}$ signals, downsamples the signals and filters the components in a narrow bandwidth. The low pass filter is implemented using a Finite Impulse Response (FIR) filter having a frequency response of a sinc filter or a $sinc^M$ filter, i.e., a cascade of M sinc filters connected in series. The sinc decimator and low pass filter 65 is used to reduce the rate of a signal from the sampling rate of 500 KHz to a down-sampled rate. In this case the decimation ratio is 50, i.e., the signals are down-sampled by a factor of 50. The sinc decimator feeds an FIR low pass filter which outputs the magnitude |I| and phase $\angle I$ of $I_{out}$ and the magnitude |V| and phase $\angle V$ of $V_{out}$ in a narrow bandwidth. The narrow bandwidth is less that 100 Hz, preferably less than 75 Hz and preferably less than 40 Hz. Further details of the sinc decimator and low pass filter 65 are provided in U.S. Pat. No. 6,968,296, assigned to Radiodetection Limited on its face, the contents of which are incorporated herein by reference.

The $I_{demand}$ signal and the magnitude |I| and phase $\angle I$ of $I_{out}$ are passed to a summing stage 67 which calculates the current error between the $I_{demand}$ signal and the $I_{out}$ signal. The magnitude |V| and phase $\angle V$ of $V_{out}$ and the current error are passed to clamping stages 69 to limit the maximum drive voltage and current of the output module 31 to the maximum available rail voltage and current respectively. The outputs of the clamping stage 69 are passed to a look-up function 71. The look-up function 71 takes magnitude and phase information for the feedback voltage and current to provide a single output to a proportional-integral-derivative (PID) controller 73. The look-up function 71 calculates the anticipated drive levels to achieve the demand level but within the load line characteristics of the transmitter, in this case 10 W. For a low impedance or dominantly capacitive load the system will end stop on maximum current; conversely for a high impedance the voltage limit will prevail. Where the function can accommodate the demand signal the control law will follow the demand level to a very high accuracy (1 part in 1000).

The PID controller 73 is a standard algorithm which ensures that the output voltage corrects to the load dynamics and demand with accuracy and fast response, typically a step response of 100 ms.

The output of the PID controller 73 is passed to a low pass filter 75 and the filtered output modulates 77 a sine wave generated in the IQ oscillator 63 to produce the drive waveform 39 which is fed to the DAC 41 and variable power supply 43 of FIG. 3.

A high bandwidth (500 KHz) phase sensitive feedback control law, acting as a feedback means, is implemented in the transmitter 3 by digital signal processing so that by implementing phase-quadrature feedback control the system can adapt intrinsically to reactive loads (capacitive or inductive). By using a high bandwidth control law the transmitter 3 can tolerate sudden changes in load which may arise, for example, when the load changes from a low impedance load to an infinite impedance load, e.g., when the load is disconnected from the output module 13.

The output of the DSP control law is controlled in accordance with the current demand. The voltage and current feedback signals are filtered through highly selective FIR filters so that foreign voltages (coupled from the mains or other ambient signal sources) are rejected by the control law. The resulting waveforms are therefore very stable (80 dB signal to noise ratio) and unaffected by ambient signals.

Various modifications will be apparent to those in the art and it is desired to include all such modifications as fall within the scope of the accompanying claims.

Aspects of the present invention can be implemented in any convenient form, for example using dedicated hardware, or a mixture of dedicated hardware and software. The processing apparatuses can comprise any suitably programmed apparatuses such as a general purpose computer, personal digital assistant, mobile telephone (such as a WAP or 3G-compliant phone) and so on. Since the present invention can be implemented as software, each and every aspect of the present invention thus encompasses computer software implementable on a programmable device. The computer software can be provided to the programmable device using any conventional carrier medium. The carrier medium can comprise a transient carrier medium such as an electrical, optical, microwave, acoustic or radio frequency signal carrying the computer code. An example of such a transient medium is a TCP/IP signal carrying computer code over an IP network, such as the Internet. The carrier medium can also comprise a storage medium for storing processor readable code such as a floppy disk, hard disk, CD ROM, magnetic tape device or solid state memory device.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and, accordingly, all suitable modifications and equivalents may be resorted to that fall within the scope of the invention.

We claim:

1. A transmitter comprising:
   means for generating a drive waveform signal;
   power supply means;
   amplifier means connected to the power supply and the waveform generator for producing an output drive signal based on the drive waveform signal;
   output means for acting on the output drive signal to generate an output signal having a current and a voltage; and
   feedback means for controlling the amplifier means on the basis of the output signal wherein the feedback means provides in-phase and quadrature components of the current and voltage of the output signal.

2. A transmitter as claimed in claim 1, wherein the feedback voltage and current of the output signal are filtered through a narrow band filter.

3. A transmitter as claimed in claim 2, wherein the narrow-band filter has a bandwidth of less than 100 Hz.

4. A transmitter as claimed in claim 2, wherein the narrow-band filter is a sinc filter.

5. A transmitter as claimed in claim 1, wherein the feedback voltage and current are sampled above the Nyquist frequency with respect to the transmitter output signal.

6. A transmitter as claimed in claim 1, wherein the amplifier means comprises an H-bridge D-class amplifier and a bridge tied linear amplifier.

7. A transmitter as claimed in claim 6, wherein the H-bridge D-class amplifier operates in a range of the output signal of DC to a predetermined frequency.

8. A transmitter as claimed in claim 6, wherein the bridge tied linear amplifier is driven by the drive waveform signal in a range of the output signal above a predetermined frequency.

9. A transmitter as claimed in claim 8, wherein the bridge tied linear amplifier is driven by a variable power supply.

10. A transmitter as claimed in claim 1, wherein the drive waveform signal is generated by a proportional-integral-derivative controller.

11. A system for detecting a buried conductor comprising:
a transmitter as claimed in claim 1, and
a receiver for detecting a signal induced in said buried conductor by the output signal of the transmitter.

12. A method of generating a transmitter output signal comprising:
generating a drive waveform signal;
amplifying the drive waveform signal to produce an output drive signal;
generating an output signal based on the output drive signal, the output signal having a current and a voltage; and
feeding back in-phase and quadrature components of the current and voltage of the output signal for controlling the amplification.

13. A method as claimed in claim 12, wherein the feedback voltage and current of the output signal are filtered through a narrow band filter.

14. A method as claimed in claim 13, wherein the narrow-band filter has a bandwidth of less than 100 Hz.

15. A method as claimed in claim 13, wherein the narrow-band filter is a sinc filter.

16. A method as claimed in claim 12, wherein the feedback voltage and current are sampled above the Nyquist frequency with respect to the transmitter output signal.

17. A method as claimed in claim 12, wherein the amplification is performed by an H-bridge D-class amplifier and a bridge tied linear amplifier.

18. A method as claimed in claim 17, wherein the H-bridge D-class amplifier operates in a range of the output signal of DC to a predetermined frequency.

19. A method as claimed in claim 17, wherein the bridge tied linear amplifier is driven by the drive waveform signal in a range of the output signal above a predetermined frequency.

20. A method as claimed in claim 19, wherein the bridge tied linear amplifier is driven by a variable power supply.

21. A method as claimed in claim 12, wherein the drive waveform signal is generated by a proportional-integral-derivative controller.

22. A carrier medium carrying computer readable code for controlling a microprocessor to carry out the method of claim 12.

23. A method of detecting a buried conductor comprising:
generating a transmitter output signal, as claimed in claim 12, to induce a test signal in said buried conductor, the test signal generating an electromagnetic field; and
detecting the generated electromagnetic field.

24. A transmitter comprising:
a waveform generator for generating a drive waveform signal;
a power supply;
an amplifier stage connected to the power supply and the waveform generator for producing an output drive signal based on the drive waveform signal;
an output circuit for acting on the output drive signal to generate an output signal having a current and a voltage; and
a feedback connection for controlling the amplifier stage on the basis of the output signal wherein the feedback connection provides in-phase and quadrature components of the current and voltage of the output signal.

* * * * *